(12) United States Patent
Kim et al.

(10) Patent No.: US 9,401,289 B2
(45) Date of Patent: Jul. 26, 2016

(54) SEMICONDUCTOR DEVICE AND METHOD OF BACKGRINDING AND SINGULATION OF SEMICONDUCTOR WAFER WHILE REDUCING KERF SHIFTING AND PROTECTING WAFER SURFACES

(75) Inventors: MinJung Kim, Kyounggi do (KR); KyungHoon Lee, Kyunggi-Do (KR); JoungIn Yang, Seoul (KR); WonIl Kwon, Seoul (KR); DaeSik Choi, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 94 days.

(21) Appl. No.: 13/488,029

(22) Filed: Jun. 4, 2012

(65) Prior Publication Data

US 2013/0320519 A1 Dec. 5, 2013

(51) Int. Cl.
| H01L 21/78 | (2006.01) |
| H01L 21/56 | (2006.01) |
| H01L 23/31 | (2006.01) |
| H01L 21/683 | (2006.01) |

(52) U.S. Cl.
CPC ............ *H01L 21/561* (2013.01); *H01L 21/568* (2013.01); *H01L 21/6835* (2013.01); *H01L 21/6836* (2013.01); *H01L 23/3114* (2013.01); *H01L 23/3171* (2013.01); *H01L 21/78* (2013.01); *H01L 2221/6834* (2013.01); *H01L 2221/68327* (2013.01); *H01L 2224/1132* (2013.01); *H01L 2224/1145* (2013.01); *H01L 2224/11334* (2013.01); *H01L 2224/11462* (2013.01); *H01L 2224/11464* (2013.01); *H01L 2224/11849* (2013.01); *H01L 2224/11901* (2013.01); *H01L 2224/13022* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/48091* (2013.01); *H01L 2224/48247* (2013.01); *H01L 2224/73265* (2013.01); *H01L 2924/13091* (2013.01)

(58) Field of Classification Search
CPC .............................................. H01L 2924/01029
USPC ............. 257/734, E21.599, E23.01; 438/462, 438/463

See application file for complete search history.

(56) References Cited

U.S. PATENT DOCUMENTS

| 6,338,980 B1 | 1/2002 | Satoh |
| 7,005,324 B2 | 2/2006 | Imai |
| 8,030,769 B2 | 10/2011 | Shin et al. |
| 2007/0196999 A1* | 8/2007 | Tamura et al. ................ 438/458 |

(Continued)

*Primary Examiner* — Edward Wojciechowicz
(74) *Attorney, Agent, or Firm* — Robert D. Atkins; Patent Law Group: Atkins and Associates, P.C.

(57) ABSTRACT

A semiconductor device has a semiconductor wafer with an interconnect structure formed over a first surface of the wafer. A trench is formed in a non-active area of the semiconductor wafer from the first surface partially through the semiconductor wafer. A protective coating is formed over the first surface and into the trench. A lamination tape is applied over the protective coating. A portion of a second surface of the semiconductor wafer is removed by backgrinding or wafer thinning to expose the protecting coating in the trench. A die attach film is applied over the second surface of the semiconductor wafer. A cut or modified region is formed in the die attach film under the trench using a laser. The semiconductor wafer is expanded to separate the cut or modified region of the die attach film and singulate the semiconductor wafer.

14 Claims, 9 Drawing Sheets

(56) References Cited

U.S. PATENT DOCUMENTS

2008/0315434 A1* 12/2008 McElrea et al. .............. 257/777
2011/0266656 A1 11/2011 Yun et al.
2012/0273926 A1* 11/2012 Pagaila .......................... 257/659
2012/0322233 A1* 12/2012 Lei et al. ........................ 438/462

* cited by examiner

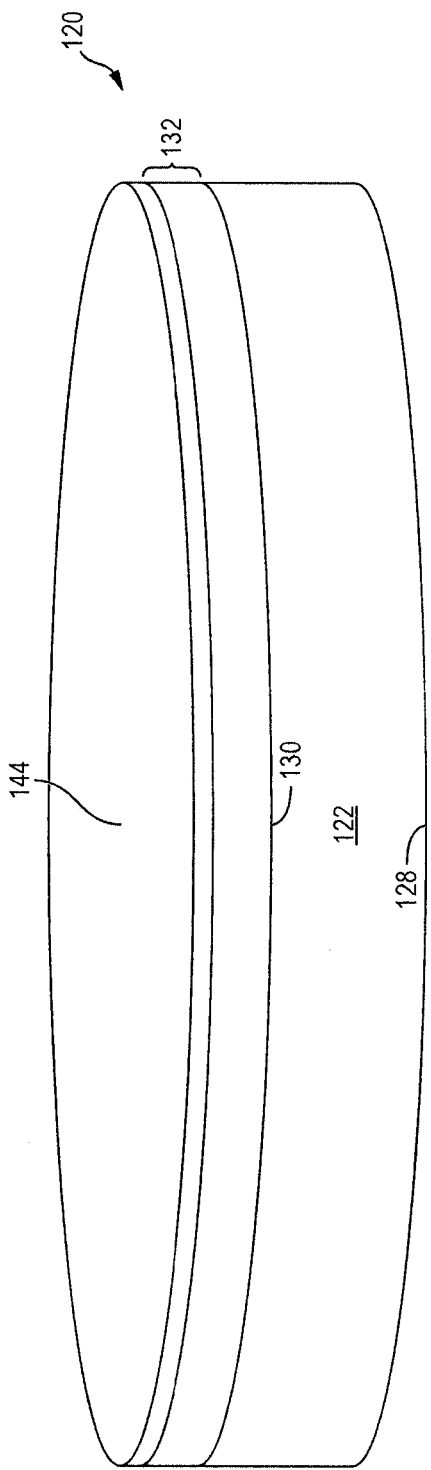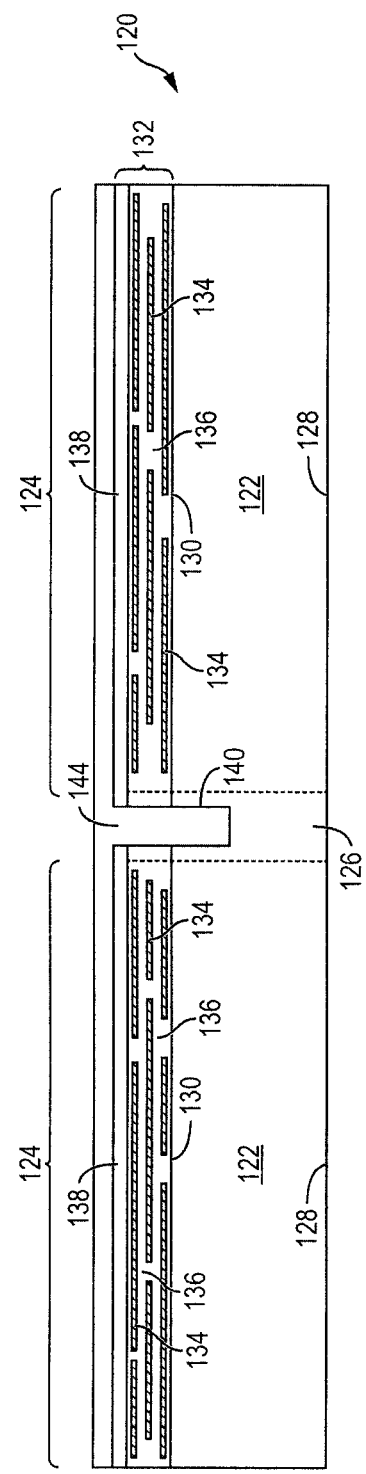

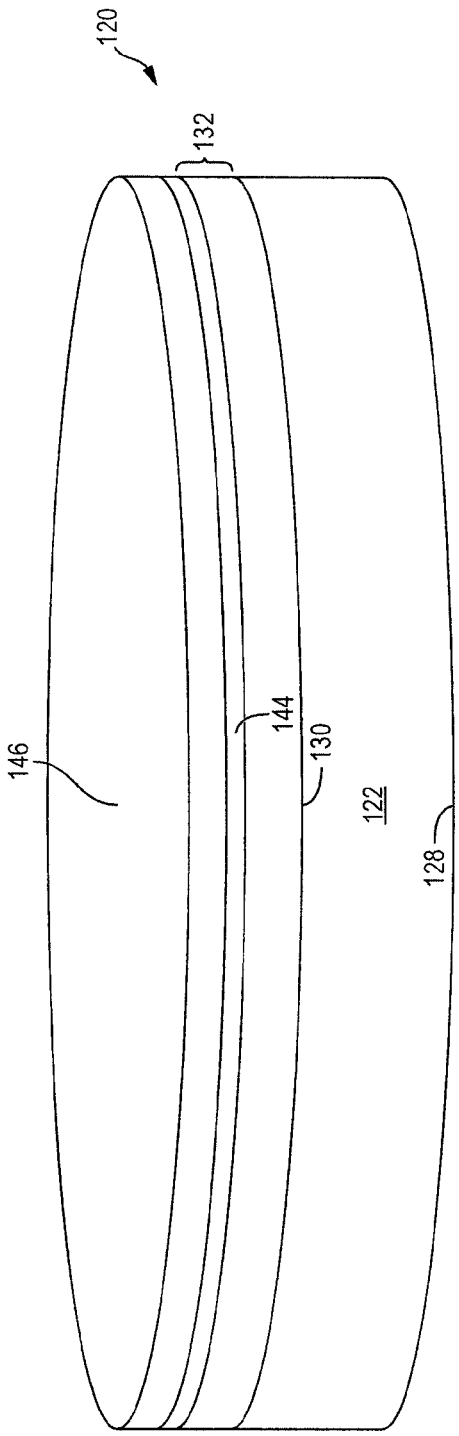
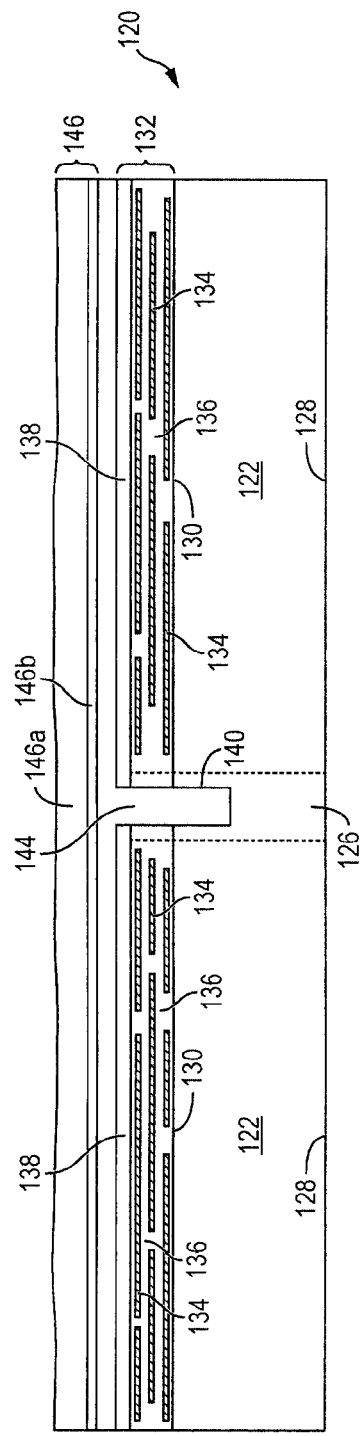
FIG. 3e
FIG. 3f

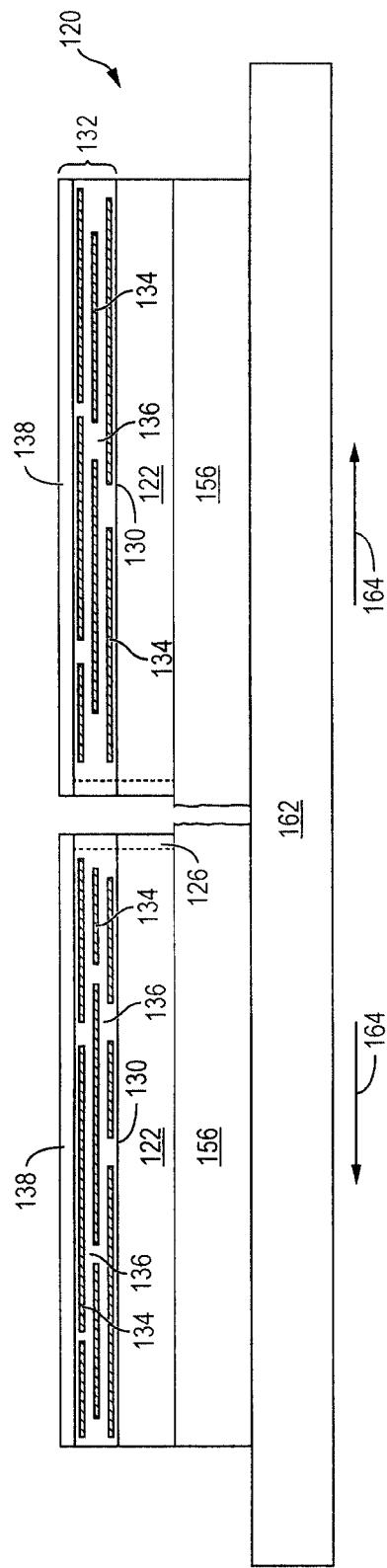
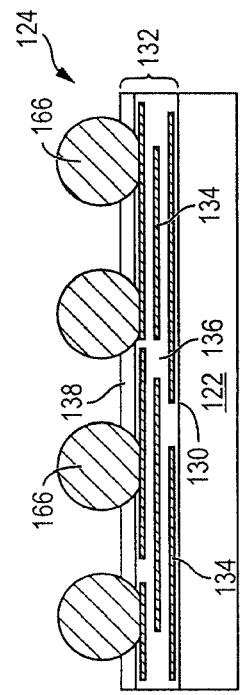

SEMICONDUCTOR DEVICE AND METHOD OF BACKGRINDING AND SINGULATION OF SEMICONDUCTOR WAFER WHILE REDUCING KERF SHIFTING AND PROTECTING WAFER SURFACES

FIELD OF THE INVENTION

The present invention relates in general to semiconductor devices and, more particularly, to a semiconductor device and method of backgrinding or wafer thinning and singulation of a semiconductor wafer while reducing kerf shifting and protecting surfaces of the wafer.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

The semiconductor wafer is singulated to separate the semiconductor die. In some applications, the semiconductor wafer undergoes a backgrinding operation prior to singulation to reduce the thickness of the substrate. The semiconductor wafer is subject to kerf shifting under the stress and pressure of backgrinding. In addition, the backgrinding operation can leave debris and contaminants of one or both surfaces of the semiconductor wafer.

SUMMARY OF THE INVENTION

A need exists to reduce kerf shifting and accumulation of debris and contaminants of one or both surfaces of the semiconductor wafer during backgrinding or wafer thinning operation. Accordingly, in one embodiment, the present invention is a method of making a semiconductor device comprising the steps of providing a semiconductor wafer, forming a trench in a non-active area of the semiconductor wafer from a first surface of the semiconductor wafer partially through the semiconductor wafer, forming a protective coating over the first surface of the semiconductor wafer and into the trench, applying a lamination tape over the protective coating, removing a portion of a second surface of the semiconductor wafer opposite the first surface of the semiconductor wafer to expose the protecting coating in the trench, applying a die attach film over the second surface of the semiconductor wafer, forming a modified region in the die attach film under the trench, and expanding the semiconductor wafer to separate the modified region of the die attach film and singulate the semiconductor wafer.

In another embodiment, the present invention is a method of making a semiconductor device comprising the steps of providing a semiconductor wafer, forming a trench from a first surface of the semiconductor wafer partially through the semiconductor wafer, forming a protective coating over the first surface of the semiconductor wafer and into the trench, removing a portion of a second surface of the semiconductor wafer opposite the first surface of the semiconductor wafer to expose the protecting coating in the trench, applying a die attach film over the second surface of the semiconductor wafer, forming a modified region in the die attach film under the trench, and separating the modified region of the die attach film to singulate the semiconductor wafer.

In another embodiment, the present invention is a method of making a semiconductor device comprising the steps of providing a semiconductor wafer, forming a protective coating over a first surface of the semiconductor wafer, applying a die attach film over a second surface of the semiconductor wafer opposite the first surface of the semiconductor wafer, forming a modified region in the die attach film under the trench, and separating the modified region of the die attach film to singulate the semiconductor wafer.

In another embodiment, the present invention is a semiconductor device comprising a semiconductor wafer and trench formed from a first surface of the semiconductor wafer partially through the semiconductor wafer. A protective coating is formed over the first surface of the semiconductor wafer and into the trench. A die attach film is applied over a second surface of the semiconductor wafer opposite the first surface of the semiconductor wafer. A modified region is formed in the die attach film under the trench. The modified region of the die attach film is separable to singulate the semiconductor wafer.

BRIEF DESCRIPTION OF THE DRAWINGS

FIGS. 3a-3m illustrate a process of backgrinding or wafer thinning and singulation of a semiconductor wafer; and FIG. 4 illustrates the semiconductor die after singulation.

DETAILED DESCRIPTION OF THE DRAWINGS

Figure 1:
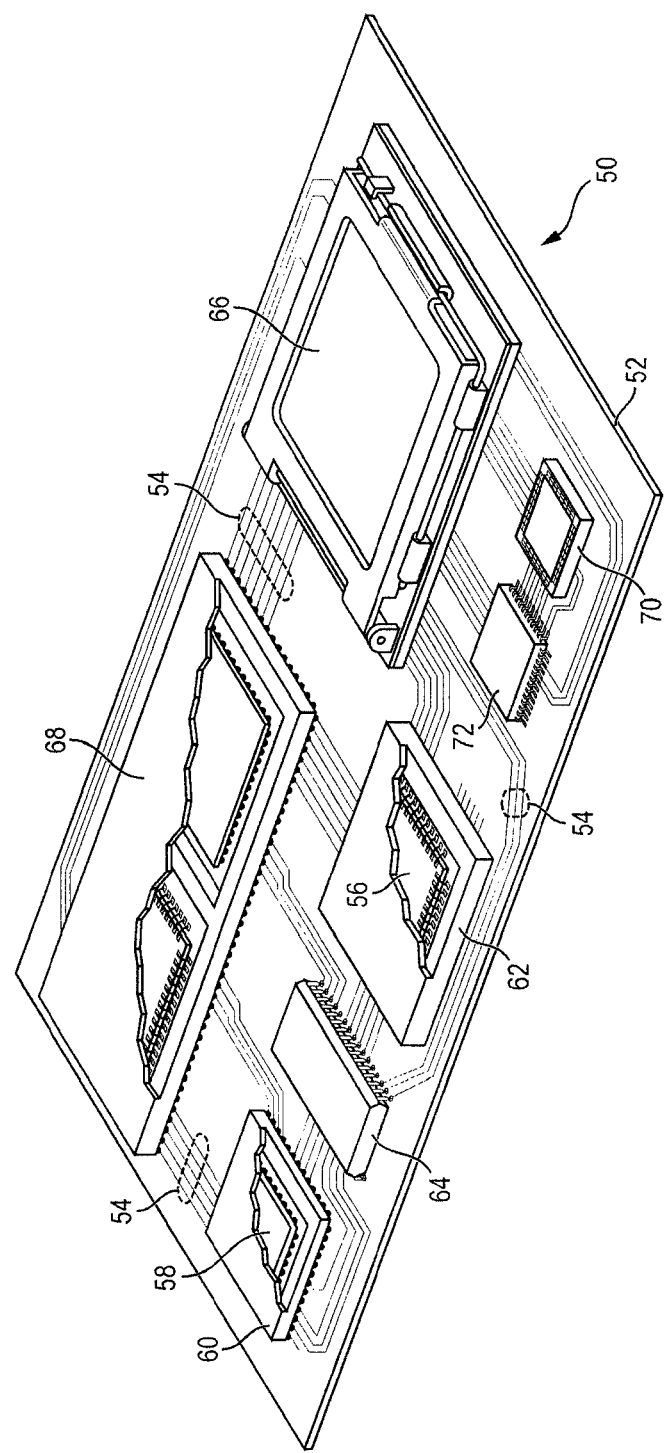
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist is removed using a solvent, exposing portions of the underlying layer to be patterned. The remainder of the photoresist is removed leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
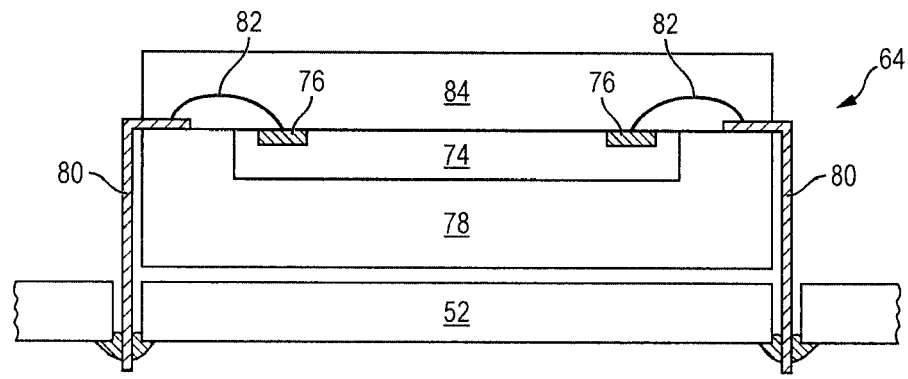
FIGS. 2a-2c illustrate further detail of the representative semiconductor packages mounted to the PCB.
Figure 2B:
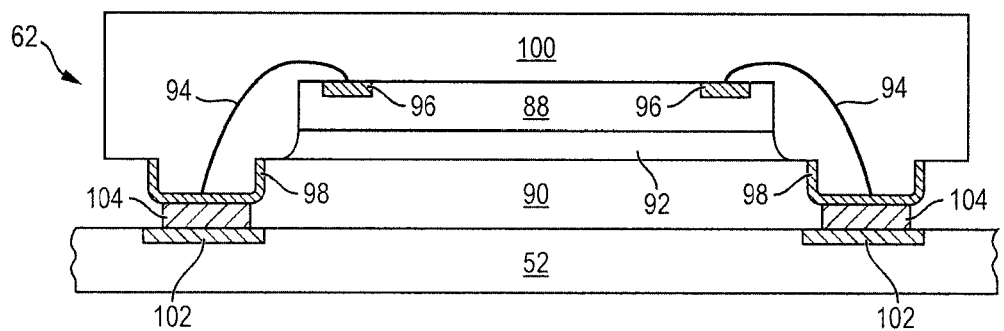
Figure 2C:
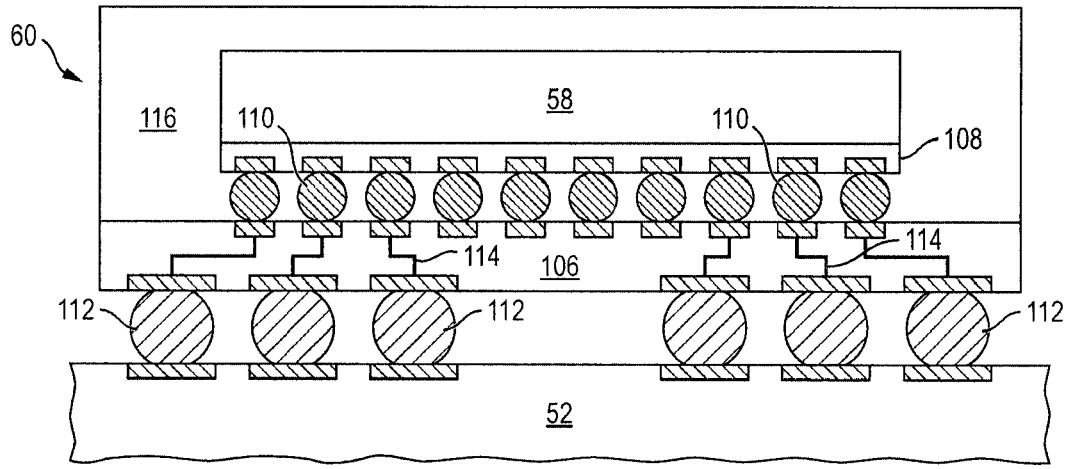

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
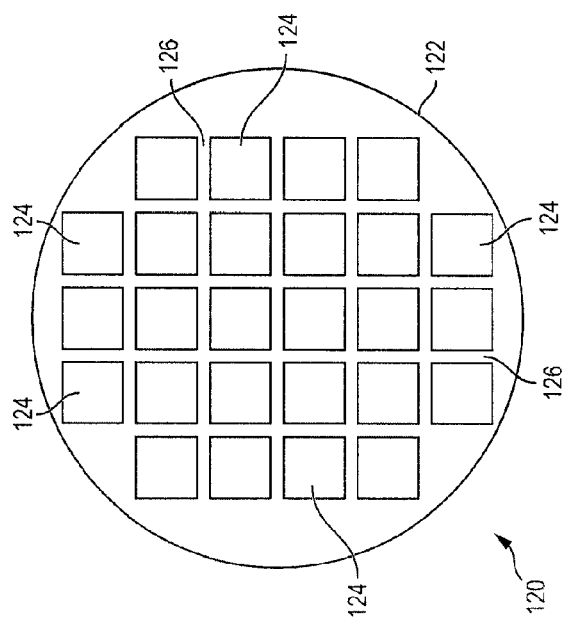

FIGS. 3a-3m illustrate, in relation to FIGS. 1 and 2a-2c, a process of backgrinding or wafer thinning and singulation of a semiconductor wafer while reducing kerf shifting and protecting surfaces of the wafer. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
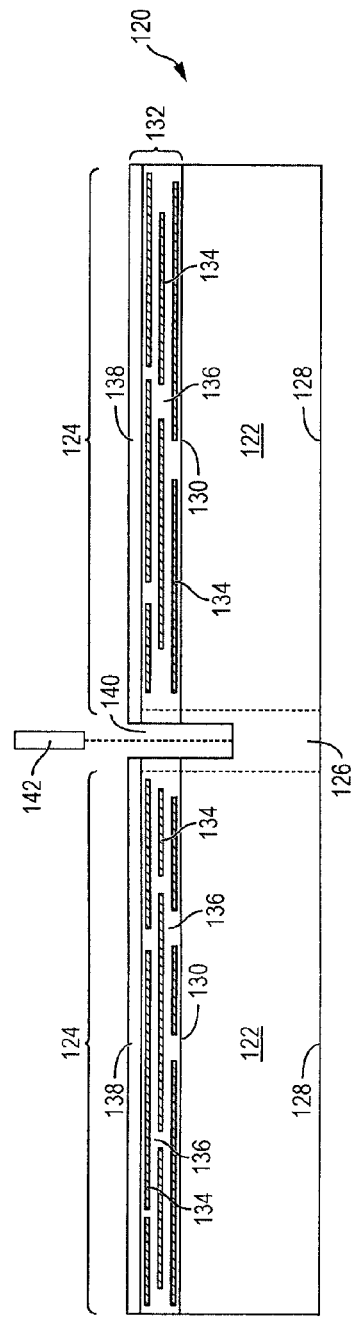

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

A build-up interconnect structure 132 is formed over active surface 130 for external electrical interconnect. The build-up interconnect structure 132 includes one or more electrically conductive layers 134 formed using PVD, CVD, electrolytic plating, electroless plating process, or other suitable metal deposition process. Conductive layer 134 can be one or more layers of Al, Cu, Sn, Ni, Au, Ag, or other suitable electrically conductive material. Conductive layer 134 is electrically connected to the active and passive circuits formed on surface 130.

An insulating layer or passivation layer 136 is formed over and between conductive layers 134 using PVD, CVD, screen printing, spin coating, spray coating, or other suitable deposition process. The insulating layer 136 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties.

An insulating layer or passivation layer 138 is formed over conductive layer 134 and insulating layer 136 using PVD, CVD, screen printing, spin coating, spray coating, or other suitable deposition process. The insulating layer 138 contains one or more layers of SiO2, Si3N4, SiOn, Ta2O5, Al2O3, benzocyclobutene (BCB), polyimide (PI), polybenzoxazoles (PBO), polymer, or other material having similar insulating and structural properties.

A trench or kerf 140 is cut into saw street 126 using saw blade or laser cutting tool 142. Trench 140 extends through build-up interconnect structure 132 and partially but not completely through substrate 122.

FIG. 3c shows a protective coating 144 formed over insulating layer 138 across an entire area of semiconductor wafer 120. Protective coating 144 can be one or more layers of a water soluble polymer material applied by screen printing, spin coating, spray coating, or other suitable deposition process. Protective coating 144 extends into trench 140, as shown in the cross-sectional view of a portion of semiconductor wafer 120 in FIG. 3d.

FIG. 3e shows a lamination tape 146 applied over protective coating 144 across an entire area of semiconductor wafer 120. In one embodiment, lamination tape 146 includes a dielectric base film 146a and adhesive layer 146b, as shown in the cross-sectional view of a portion of semiconductor wafer 120 in FIG. 3f.

Figure 3G:
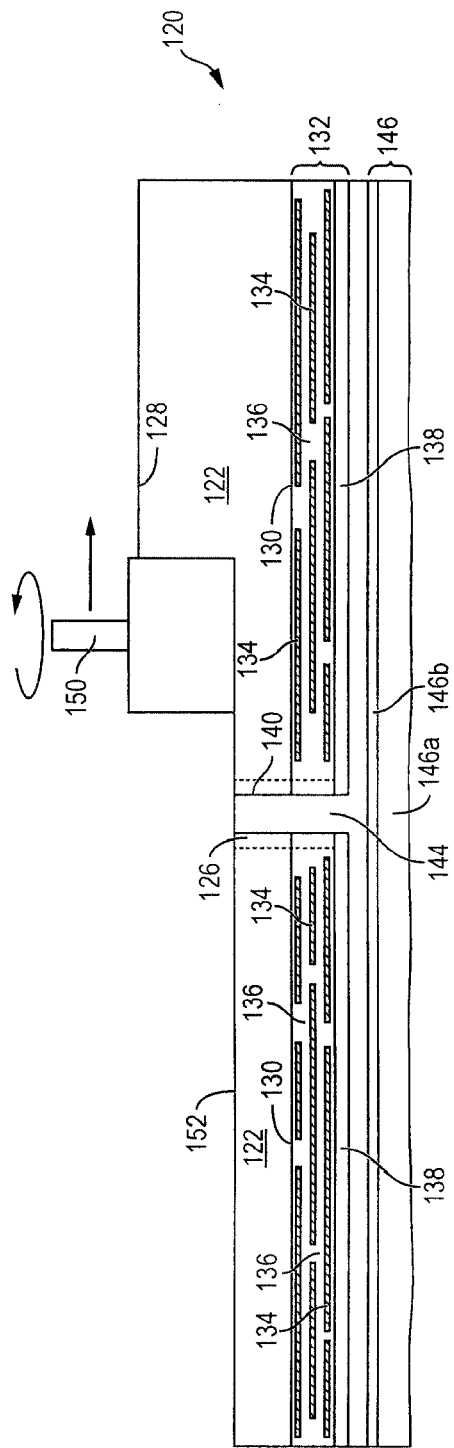
Figure 3H:
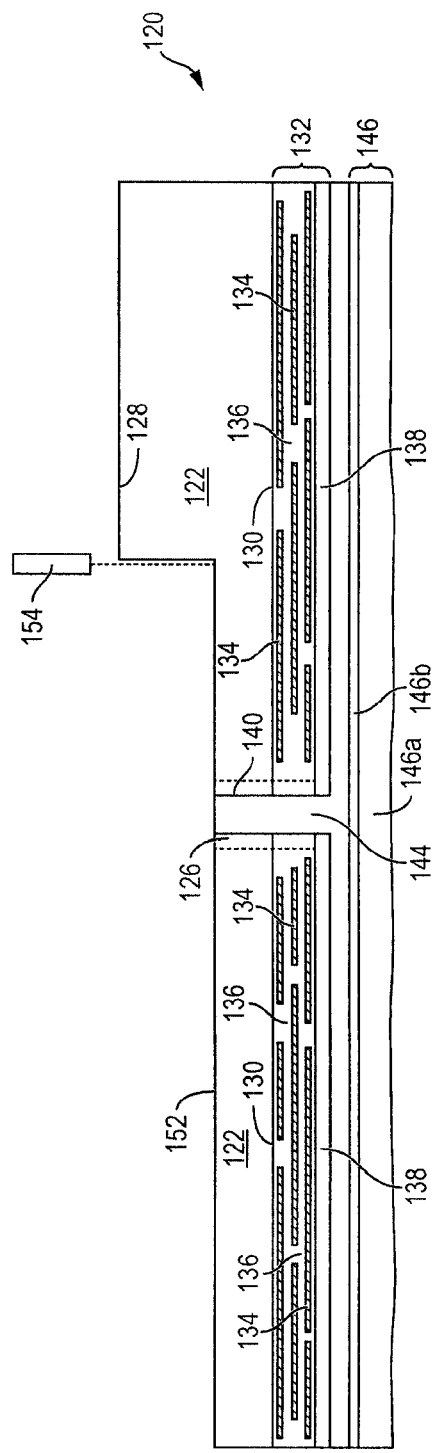

In FIG. 3g, a portion of substrate 122 is removed by grinder 150 to expose protective coating 144 within trench 140 with respect to back surface 152. Alternatively, a portion of substrate 122 is removed by direct laser ablation (LDA) using laser 154 to expose protective coating 144 within trench 140 with respect to back surface 152, as shown in FIG. 3h. In one embodiment, semiconductor wafer 120 has a thickness of 30-50 micrometers (μm) after the backgrinding or wafer thinning operation. Protective coating 144 disposed over insulating layer 138 and into trench 140 reduces kerf shift and accumulation of debris and contaminants on active surface 130 and build-up interconnect structure 132 during the backgrinding or wafer thinning operation, as well as subsequent manufacturing processes. Accordingly, protective coating 144 is applied prior to the backgrinding or wafer thinning operation of FIGS. 3g-3h.

Figure 3I:
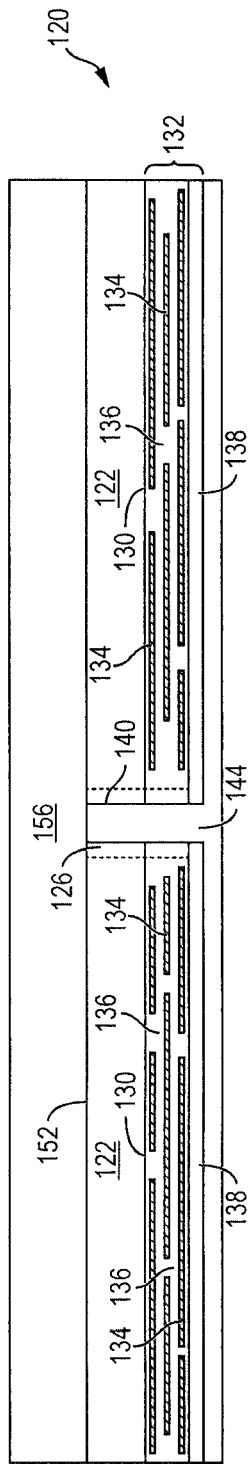

In FIG. 3i, lamination tape 146 is removed after the backgrinding or wafer thinning operation. A die attach film (DAF) 156 is applied over back surface 152 and the exposed protective coating 144. DAF 156 can be a sheet containing one or more layers of an epoxy film. DAF 156 can be applied with a roller or press. DAF 156 protects back surface 152 prior to singulation.

Figure 3J:
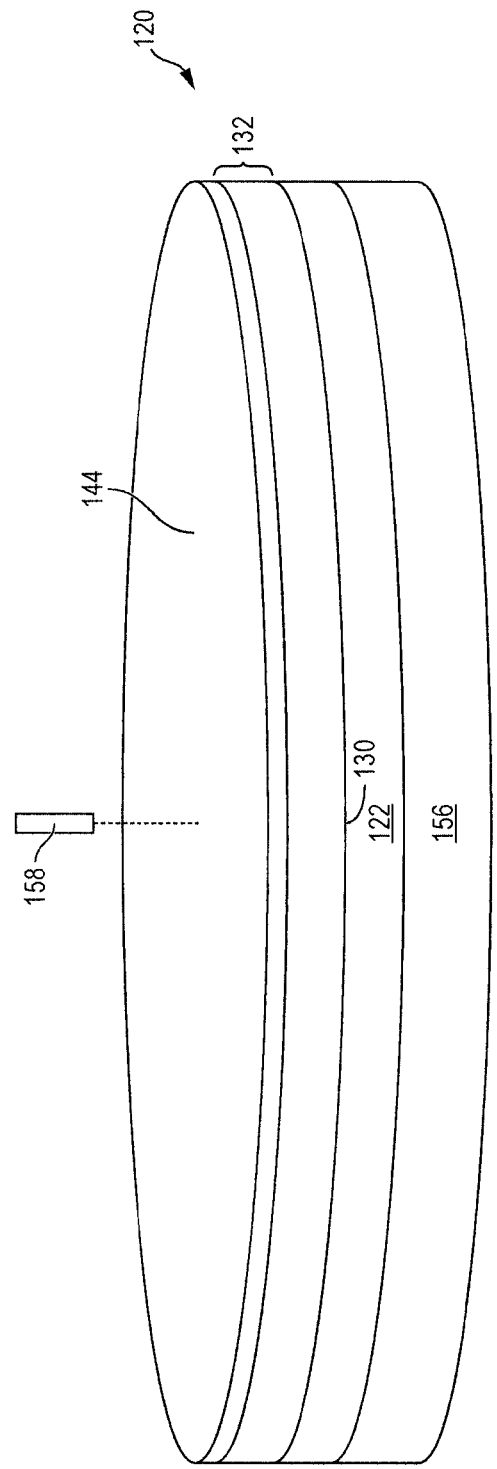
Figure 3K:
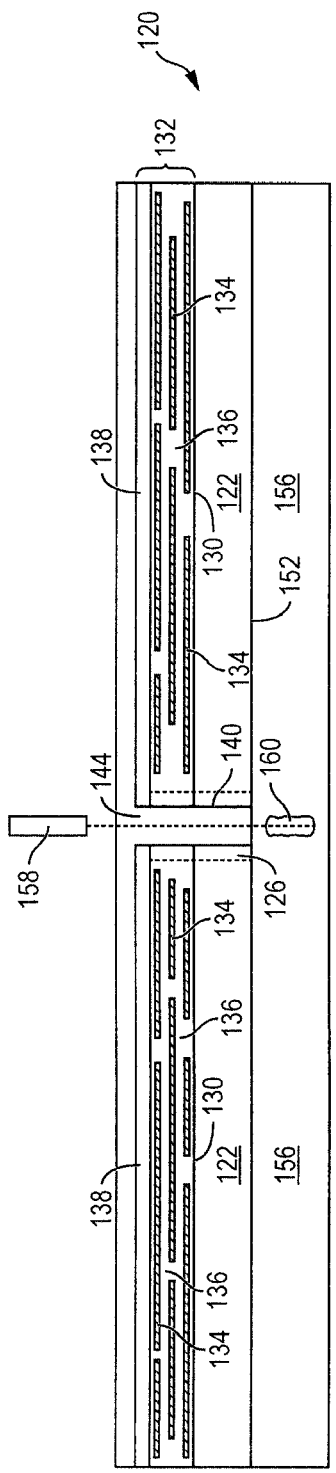

In FIG. 3j, laser 158 is positioned over protective coating 144 and emits irradiated energy through the protective coating into DAF 156 to partially cut or alter the physical characteristics of the DAF material. Alternatively, laser 158 is positioned directly over DAF 156, opposite protective coating 144, and emits irradiated energy into DAF 156 to partially cut or alter the physical characteristics of the DAF material. In one embodiment, the light energy emitted by laser 158 has a wavelength of 1064 nanometers and produces light pulses of 1 microsecond or less duration, repeated at 10 microsecond intervals, with a peak power intensity of 100 megawatts/cm². Absorption of the laser light energy at the focal point of laser 158 partially cuts or modifies the material characteristics of region 160 of DAF 156, as shown in FIG. 3k. Laser 158 passes over DAF 156 a single time or multiple times to form multiple modified regions 160 at vertically offset locations within the DAF material. The focal point of laser 158 can be altered by vertically displacing the laser, altering the configuration of the optical path that the laser energy passes through, altering the optical properties of an element of the optical path that the laser energy passes through, or altering the wavelength of the laser. The modified region 160 of DAF 156 can be sliced, cut, vaporized, displaced, or changed in structure or composition by laser 158 to create a cut, gap, crack, void, or altered state in the DAF material. The modified region 160 occupies a partial or the entire area of DAF 156 under saw street 126, and can be formed as a continuous area or as a number of vertically-stacked discreet areas. Modified region 160 can be vertical, diagonal, circular, oval, curved, or other shape. In other embodiments, modified region 160 of DAF 156 can be formed using visible light, ultraviolet light, x-rays, microwaves, acoustic energy, ion beams, high energy particles, or other forms of radiated energy.

Figure 3L:
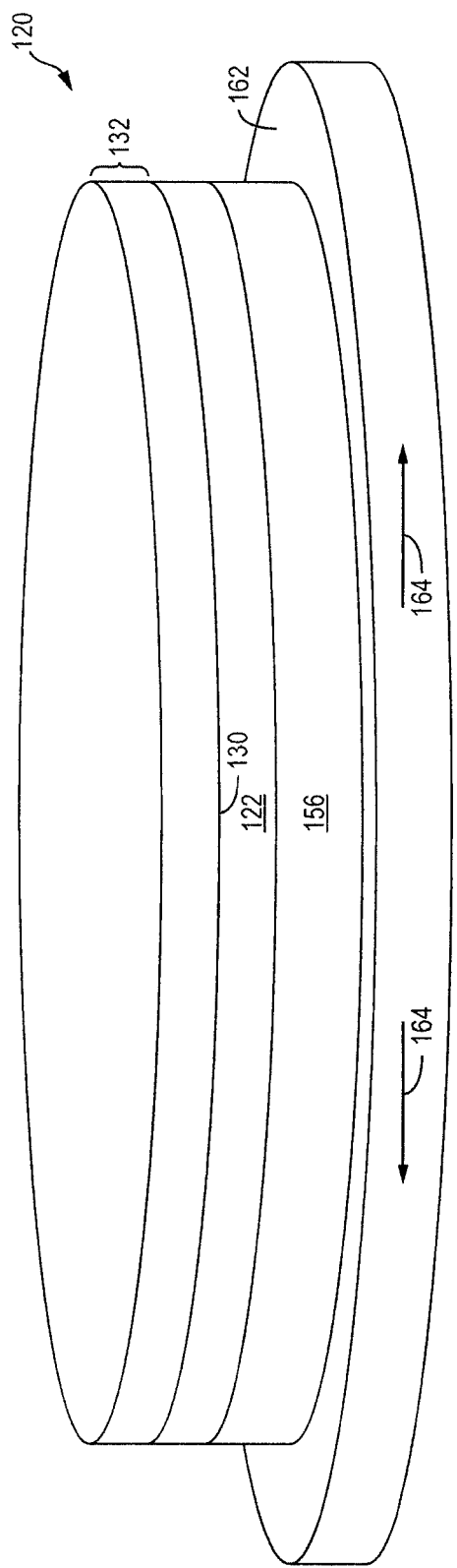

In FIG. 3l, protective coating 144 over build-up interconnect structure 132 and in trench 140 is removed by a peel-off or stripping operation. Semiconductor wafer 120 is mounted to an expansion table 162, which moves in two-dimension lateral directions, as shown by arrows 164. DAF 156 is subjected to radial expansion to impose tensile stress on cut or modified region 160, as shown in FIG. 3m. Expansion table 162 moves substantially the same distance in the x-axis and y-axis within the tolerance of the table control. The cut or modified region 160 is weaker than the unmodified material in DAF 156 around modified region 160 and readily subject to breaking, fracture, or separation under temperature change, acoustic energy, chemical reaction, or mechanical pressure or stress including tensile stress, mechanical pressure, or bending moment. The weaker cut or modified region 160 is separated to singulate semiconductor wafer 120 into individual semiconductor die 124.

FIG. 4 semiconductor die 124 after singulation. DAF 156 is removed from semiconductor die 124. A portion of insulating layers 136 and 138 is removed by a patterned etching process to expose conductive layer 134. An electrically conductive bump material is deposited over the exposed conductive layer 134 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 134 using a suitable attachment or bonding process. In one embodiment, the bump material is reflowed by heating the material above its melting point to form balls or bumps 166. In some applications, bumps 166 are reflowed a second time to improve electrical contact to conductive layer 134. Bumps 166 can also be compression bonded to conductive layer 134. Bumps 166 represent one type of interconnect structure that can be formed over conductive layer 134. The interconnect structure can also use stud bump, micro bump, or other electrical interconnect. The active and passive circuits formed on surface 130 are electrically connected to conductive layer 134 within build-up interconnect structure 132 and bumps 166.

Protective coating 144 and DAF 156 reduces kerf shifting, as well as chipping and cracking of active surface 130, build-up interconnect structure 132, back surface 152, and the edge of semiconductor die 124, during manufacturing. Protective coating 144 and DAF 156 also reduce accumulation of debris and contaminants on active surface 130, build-up interconnect structure 132, and back surface 152 from the manufacturing process leading up to singulation of semiconductor wafer 120. The singulation of semiconductor wafer 120 occurs by cutting or modifying region 160 in DAF 156 using laser 158, followed by expansion of the wafer to create stress on the cut or modified region 160 to separate semiconductor die 124.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
    a semiconductor wafer including a plurality of semiconductor die;
    a trench formed through a saw street of the semiconductor wafer between the semiconductor die;
    a protective coating disposed over a first surface of the semiconductor wafer and filling the trench between the semiconductor die;
    a die attach film disposed over a second surface of the semiconductor wafer opposite the first surface of the semiconductor wafer; and
    a modified region susceptible to fracture formed in the die attach film and aligned with the saw street between the semiconductor die.

2. The semiconductor device of claim 1, wherein the protective coating extends to the second surface of the semiconductor wafer.

3. The semiconductor device of claim 1, further including an interconnect structure formed over the first surface of the semiconductor wafer.

4. The semiconductor device of claim 1, wherein the protective coating is water soluble.

5. A semiconductor device, comprising:
    a semiconductor wafer including a plurality of semiconductor die;
    a trench formed through a saw street of the semiconductor wafer between the semiconductor die;
    a protective coating completely covering a first surface of the semiconductor wafer and filling the trench between the semiconductor die; and
    a die attach film disposed over a second surface of the semiconductor wafer opposite the first surface of the semiconductor wafer.

6. The semiconductor device of claim 5, wherein the protective coating is water soluble.

7. The semiconductor device of claim 5, further including an interconnect structure formed over the first surface of the semiconductor wafer.

8. The semiconductor device of claim 5, further including a modified region formed in the die attach film and aligned with the saw street.

9. A semiconductor device, comprising:
    a semiconductor wafer including a plurality of semiconductor die;

a trench formed through a first surface of the semiconductor wafer; and a protective coating completely covering the first surface of the semiconductor wafer and extending into the trench.

10. The semiconductor device of claim 9, further including a die attach film disposed over a second surface of the semiconductor wafer opposite the first surface.

11. The semiconductor device of claim 9, wherein the protective coating fills the trench.

12. The semiconductor device of claim 9, further including a lamination tape disposed over the protective coating.

13. The semiconductor device of claim 10, further including a modified region susceptible to fracture formed in the die attach film.

14. The semiconductor device of claim 9, wherein the protective coating is water soluble.

* * * * *